United States Patent
Stortini et al.

(10) Patent No.: US 7,884,489 B1
(45) Date of Patent: Feb. 8, 2011

(54) PRESS-FIT INTEGRATED CIRCUIT PACKAGE INVOLVING COMPRESSED SPRING CONTACT BEAMS

(75) Inventors: Thomas Stortini, Fremont, CA (US); John A. Ransom, Nampa, ID (US)

(73) Assignee: IXYS CH GmbH (CH)

( * ) Notice: Subject to any disclaimer, the term of this patent is extended or adjusted under 35 U.S.C. 154(b) by 0 days.

(21) Appl. No.: 12/657,094

(22) Filed: Jan. 12, 2010

Related U.S. Application Data

(63) Continuation of application No. 12/214,479, filed on Jun. 18, 2008, now Pat. No. 7,683,494.

(51) Int. Cl.
H01L 23/52 (2006.01)
H01L 23/48 (2006.01)
H01L 29/40 (2006.01)
H01L 23/495 (2006.01)
H01L 23/485 (2006.01)
H01L 23/498 (2006.01)

(52) U.S. Cl. .......................... 257/785; 257/737; 257/668; 257/E23.021; 257/E23.069

(58) Field of Classification Search ................. 257/785, 257/737, 668, E23.069, E23.021
See application file for complete search history.

(56) References Cited

U.S. PATENT DOCUMENTS

| | | | |
|---|---|---|---|
| 3,762,039 A | 10/1973 | Douglass et al. | 29/588 |
| 4,107,555 A | 8/1978 | Haas et al. | 307/308 |
| 4,553,192 A | 11/1985 | Babuka et al. | 361/743 |
| 5,570,273 A | 10/1996 | Siegel et al. | 361/773 |
| 5,772,451 A | 6/1998 | Dozier et al. | 439/70 |
| 6,302,719 B1 | 10/2001 | Corisis et al. | 439/330 |
| 6,482,013 B2 | 11/2002 | Eldridge et al. | 439/66 |
| 6,669,489 B1 * | 12/2003 | Dozier et al. | 439/71 |
| 6,741,085 B1 * | 5/2004 | Khandros et al. | 324/750.22 |
| 6,848,936 B2 | 2/2005 | DeFord | 439/526 |
| 7,279,788 B2 * | 10/2007 | Canella | 257/692 |
| 7,579,269 B2 * | 8/2009 | Eldridge et al. | 438/618 |
| 7,621,044 B2 * | 11/2009 | Eldridge et al. | 29/876 |

* cited by examiner

Primary Examiner—Luan C Thai
(74) Attorney, Agent, or Firm—Imperium Patent Works; T. Lester Wallace; Darien K. Wallace

(57) ABSTRACT

An insulative substrate includes a plurality of flexible retaining clips and a plurality of alignment and retaining pins. A metal leadframe includes a plurality of leads. Each lead terminates in a spring contact beam portion. The leadframe is attached to the substrate (for example, by fitting a hole in each lead over a corresponding alignment and retaining pin and then thermally deforming the pin to hold the lead in place). An integrated circuit is press-fit down through the retaining clips such that pads on the face side of the integrated circuit contact and compress the spring contact beams of the leads. After the press-fit step, the retaining clips hold the integrated circuit in place. The resulting assembly is encapsulated. In a cutting and bending step, the leads are singulated and formed to have a desired shape. The resulting low-cost package involves no wire-bonding and no flip-chip bond bump forming steps.

20 Claims, 10 Drawing Sheets

CROSS-SECTIONAL VIEW ALONG LINE A-A

CROSS-SECTIONAL VIEW ALONG LINE B-B

PRESS-FIT INTEGRATED CIRCUIT PACKAGE
(INJECTION MOLDED EMBODIMENT)

PRESS-FIT INTEGRATED CIRCUIT PACKAGE
(GLOB TOP EMBODIMENT)

PRESS-FIT INTEGRATED CIRCUIT PACKAGE
(ENCAPSULANT NOT SHOWN)

TOP-DOWN VIEW
(ENCAPSULANT NOT SHOWN)

BOTTOM-UP VIEW
(ONLY LEADS AND DIE ARE SHOWN)

TOP-DOWN VIEW
(SHOWING CROSS-SECTIONAL VIEW LINES)

CROSS-SECTIONAL VIEW ALONG
LINE A-A

CROSS-SECTIONAL VIEW ALONG
LINE B-B

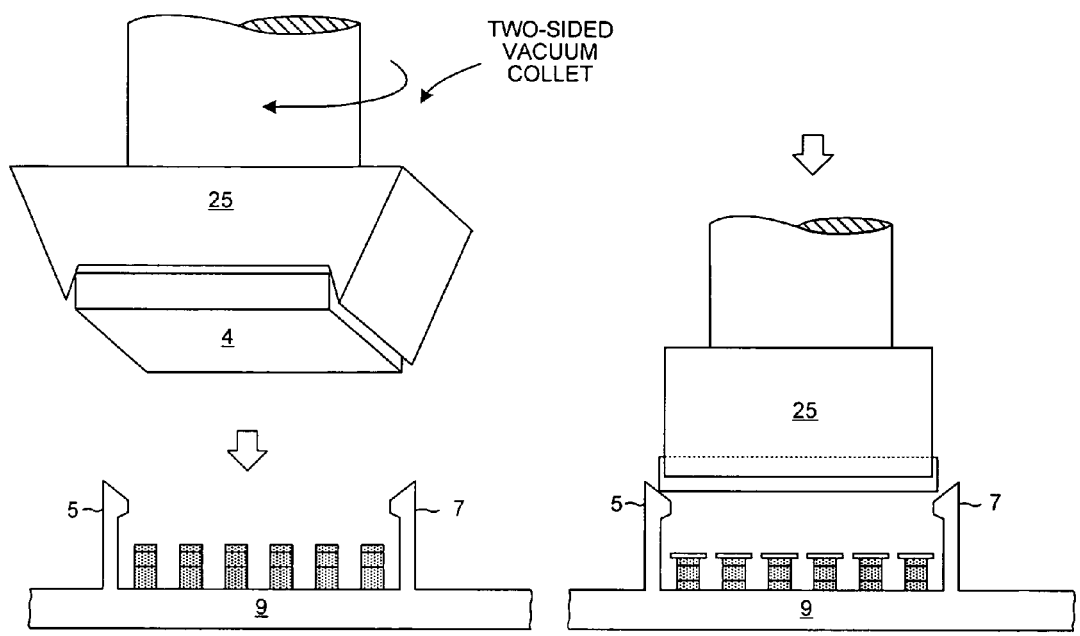
FIG. 9A  FIG. 9B
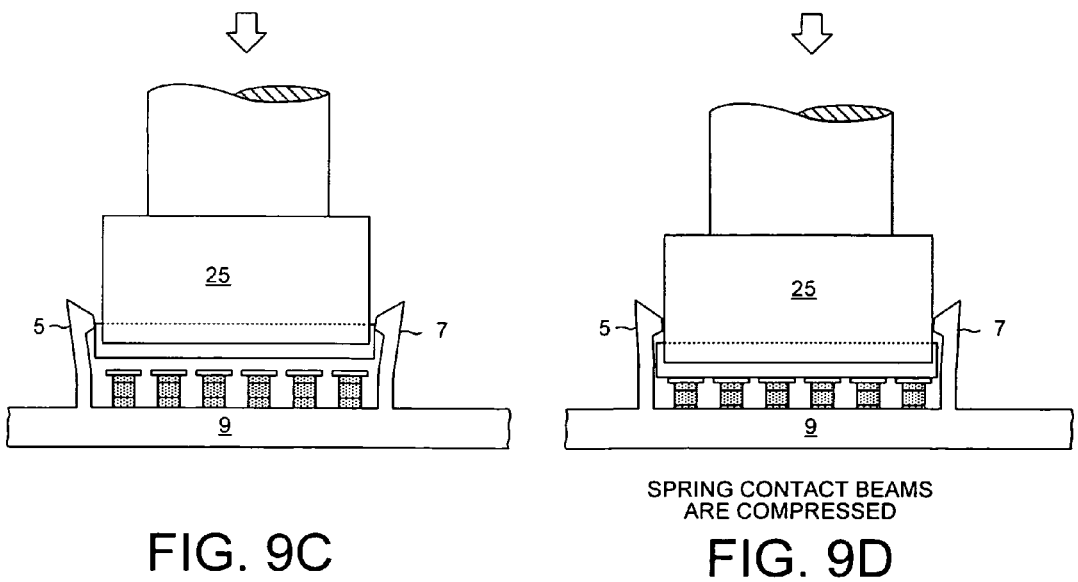
FIG. 9C
SPRING CONTACT BEAMS ARE COMPRESSED
FIG. 9D RETAINING CLIPS HOLD DIE SUCH THAT SPRING
CONTACT BEAMS REMAIN COMPRESSED AS
COLLET IS REMOVED ALTERNATE EMBODIMENT - EACH LEAD IS HELD IN PLACE
BY RETAINING CLIPS AND A GUIDE SLOT IN A GUIDE RAIL

PRESS-FIT INTEGRATED CIRCUIT PACKAGE INVOLVING COMPRESSED SPRING CONTACT BEAMS

CROSS REFERENCE TO RELATED APPLICATION

This application is a continuation of, and claims priority under 35 U.S.C. §120 from, nonprovisional U.S. patent application Ser. No. 12/214,479 entitled "Press-Fit Integrated Circuit Package Involving Compressed Spring Contact Beams," filed on Jun. 18, 2008, now U.S. Pat. No. 7,683,494, the subject matter of which is incorporated herein by reference.

TECHNICAL FIELD

The described embodiments relate to integrated circuit packaging.

BACKGROUND INFORMATION

Many different methods are known for packaging integrated circuits. In one method, an integrated circuit is die bonded face-side up to a metal leadframe. The leadframe is made of stamped metal and includes a plurality of radially extending leads. The leadframe is one leadframe of many in a strip of leadframes. The leads of each leadframe are held together by rails of metal material. Once the integrated circuit is attached to the center of the leadframe, each individual bond pad on the integrated circuit is typically wire bonded to the tip of an associated one of the radially extending leads. After the wire-bonding process is completed, a plastic encapsulant is injection molded around the die and wire bonds such that the leads extend outward from the plastic. After the plastic has hardened, the rails are typically cut away to singulate the leads from one another and to separate the resulting integrated circuit package from other packages formed onto a strip of such leadframes. The outwardly extending leads are bent into a desired shape for a lead of the resulting package. Performing the wire bonding step in the above-described packaging process involves cost.

In a second method, often referred to as "flip-chip" packaging or Controlled Collapse Chip Connection (C4) packaging, a small bonding bump of conductive material such as solder is formed on each contact pad of the integrated circuit. These flip-chip bonding bumps extend upward from the surface of the face side of the integrated circuit. Rather than wire bonding pads of the integrated circuit to the various leads of the package, the integrated circuit is placed face-side down such that the bond bumps extend down and make electrical and physical contact with tips of the leads. In one example, the leads are leads of stamped metal as described above. A soldering process is then performed such that the integrated flip-chip bond bumps are soldered to the integrated circuit pads to the leads. A plastic encapsulant is then injection molded around the die such that the leads extend outward from the plastic. After the plastic has hardened, the rails are then cut away to singulate the package as in the wire-bonded example explained above, and the leads a bent into the desired lead shape.

There are many different variations of flip-chip bonding, and the technique works well; but there are costs to using the technique. Extra semiconductor processing steps are involved in growing and/or placing the flip-chip bond bumps on the die. Under-bump metallization (UBM) layers must generally be provided. The extra steps in fabricating these structures and layers would otherwise not need to be performed if the flip-chip bond bumps were not provided on the integrated circuit. Carrying out the extra bump-forming steps therefore involves an expense. Moreover, there are often licensing payments that must be made and intellectual property issues that must be addressed in order to use many flip-chip packaging processes. Avoiding those costs and complexities is desired.

Bare integrated circuit dice can be directly reflow soldered to printed circuit boards of electronic consumer devices without integrated circuit packages, but this generally involves the semiconductor manufacturer losing control of the dice and can introduce reliability problems. For example, solvents used to clean printed circuit boards in printed circuit board assembly houses, if such solvents come into contact with bare semiconductor dice, can compromise the dice and affect the future reliability of the dice. Bonding bare dice directly to printed circuit boards of ultimate electronic consumer devices is therefore to be avoided. A suitable low-cost integrated circuit package is needed.

SUMMARY

A press-fit integrated circuit package involves no wire-bonding and no flip-chip bond bump forming processing steps. In one embodiment, a precision injection molded insulative substrate is formed. The injection molded substrate includes a plurality of flexible retaining clips and a plurality of alignment and retaining pins. A stamped metal leadframe includes a plurality of leads. The metal leadframe can also be formed by an etching process. Each lead of the leadframe terminates in a spring contact beam portion. The leadframe is attached to the substrate. One way the leadframe can be attached to the substrate is by fitting a hole in each lead over a corresponding one of the alignment and retaining pins in the substrate. Each pin is then thermally deformed into a mushroom shape, thereby permanently fixing its corresponding lead in place and to the substrate. There are, however, other ways that the leadframe can be attached to the substrate.

An integrated circuit die is then press-fit, face side down, through the retaining clips such that pads on the face side of the integrated circuit die contact and compress the spring contact beams of the leads. Once the integrated circuit die has been pressed toward the substrate far enough to compress the spring contact leads, the retaining clips of the substrate snap back over edges of the integrated circuit die in a self-locking fashion, thereby holding the integrated circuit die in place. After this press-fit step, the resulting assembly may be encapsulated. In one example, the encapsulant forms a glob-top over the die, but does not cover then entire upper surface of the substrate and leads. In another example, the encapsulant is an injection molded epoxy resin that encapsulates the entire substrate and die assembly. Next, after encapsulation, in a cutting and bending step, the ends of the leads that protrude from the encapsulant are simultaneously singulated one from another and are formed to have a desired lead shape. In one example, the desired lead shape is a gull-wing shape.

Because the integrated circuit die is not attached to the substrate with adhesive and is not wire-bonded or soldered to the leads, the integrated circuit die is easily removed from the package in examples where the package does not include encapsulant. The package can then be reused if desired by press-fitting another integrated circuit into the package. The size and shape of the package can be made to match many standard integrated circuit packages. The novel package is particularly usable in ultra low cost applications that do not require a high degree of reliability.

In one example, the novel integrated circuit package is used to package a microcontroller in an ultra low cost hand-held infrared (IR) remote control device such as the type of remote control device used in the home to control electronic consumer devices such as televisions. Manufacturing of the hand held infrared remote control device is often extremely cost sensitive, and avoiding the cost of gold wire bonds and avoiding the costs associated with providing flip-chip bond bumps is particularly desirable in the remote control device application because achieving low manufacturing cost is very important but achieving high reliability of the device is less important. (The guaranteed usable lifetime of the remote control device may, for example, be less than ten years.) The spring contact beam portions of the lead can make direct contact with standard aluminum pads on the integrated circuit die, where these aluminum pads could, if the die were packaged in another type of package, be utilized for standard gold wire bond attachment to a leadframe. A single integrated circuit design is therefore usable both in the novel press-fit package as well as in a standard gold wire bonded package.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 9A-9E illustrate steps in a novel method of assembling the novel press-fit package 1.

DETAILED DESCRIPTION

Figure 1:
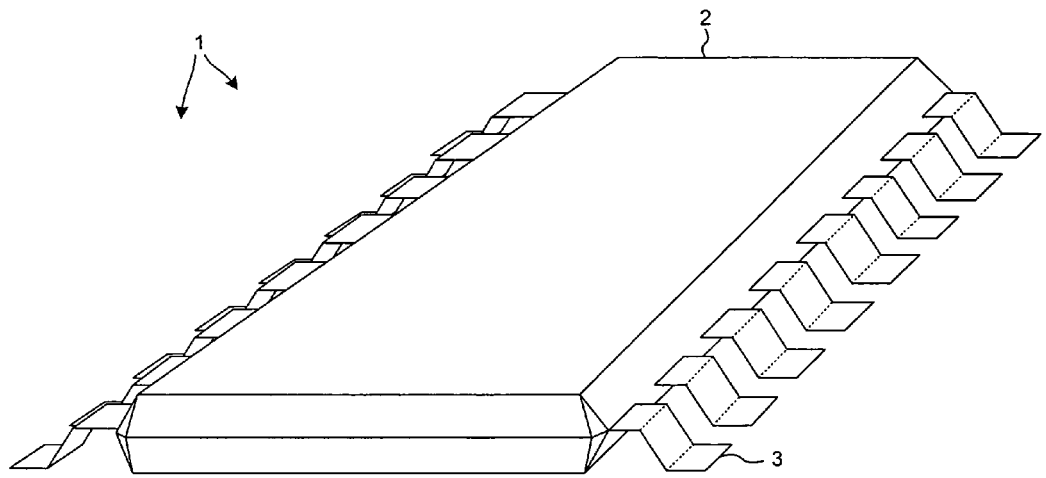
FIGS. 1 and 2 are perspective views of two different embodiments of a novel press-fit integrated circuit package.
Figure 2:
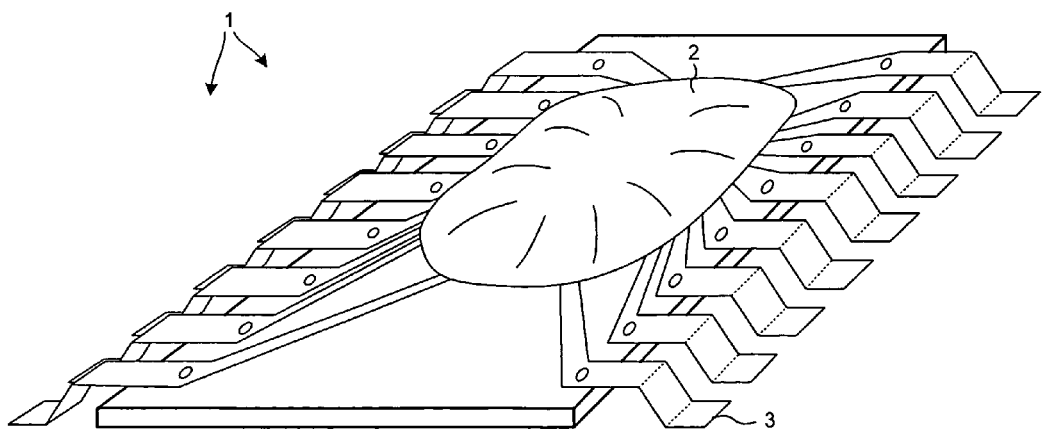

FIGS. 1 and 2 are perspective views of two different embodiments of a novel press-fit integrated circuit package 1. In FIG. 1, an encapsulant 2 that encapsulates and protects the integrated circuit within the package is an amount of injection molded plastic. The injection molded plastic may, for example, be an epoxy thermosetting resin such as is commonly used in the manufacture of standard DIP-8 (dual in-line package, eight pin) packages. In FIG. 2, the encapsulant 2 is a "glob top" of conformal encapsulant that covers the integrated circuit as illustrated. In both examples, there are two rows of eight gull-wing-shaped leads that extend from the integrated circuit package. One row extends from one side of the package and a second row extends from a second side of the package as illustrated. Reference numeral 3 identifies one such gull-wing-shaped lead.

Figure 3:
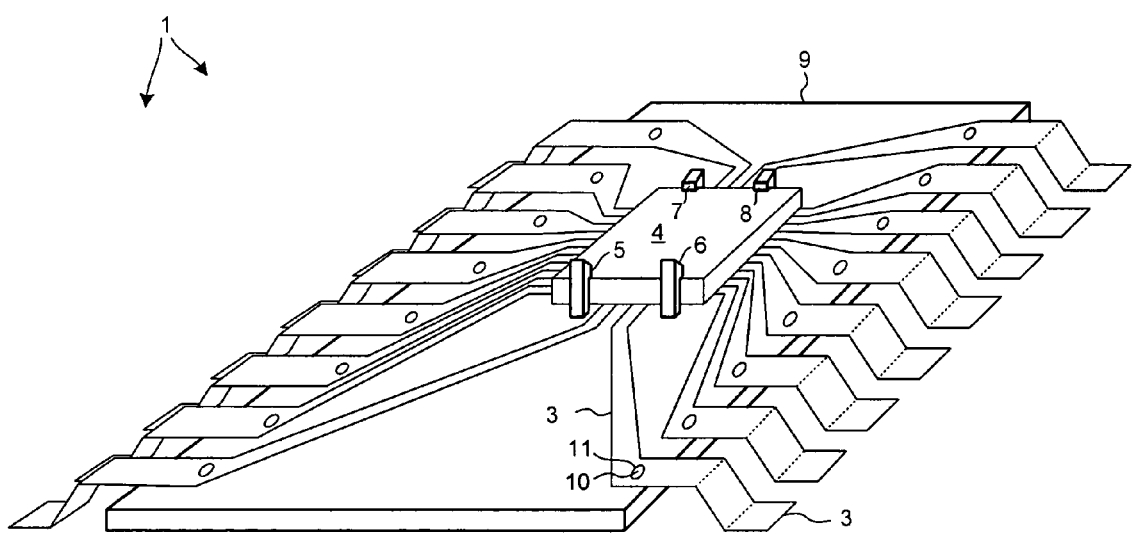
FIG. 3 is a perspective diagram that illustrates the novel press-fit integrated circuit package without any encapsulant.

FIG. 3 is a perspective diagram that illustrates the novel press-fit integrated circuit package 1 without any encapsulant. An integrated circuit die 4 is press-fit, face-side down, such that it is engaged and held in place by four flexible retaining clips 5-8. Retaining clips 5-8 are parts of an injection molded insulative plastic substrate 9. The retaining clips 5-8 extend upward from a major surface of the substrate 9 as shown. The press-fit integrated circuit package 1 also includes the gull-wing-shaped leads. Each of these leads extends in a substantially radial fashion away from a location underneath integrated circuit 4 and toward an edge of substrate 9, and terminates in a gull-wing-shaped portion. The portion of the lead under integrated circuit die 4 is a spring contact beam portion (not seen in FIG. 3). The leads are stamped from a single leadframe that is in turn stamped from a single strip of copper sheet metal. The contact beam portions of the copper leadframe may be plated with a material (for example, nickel or silver) to prevent future intermetallic formation problems between the copper of the leads and the aluminum of bond pad on die 4. In the case of press-fit package 1 being part of an IR remote control device, the lead to bond pad connections are all very low current-density connections.

Each lead has a hole. An alignment and retaining pin of the plastic material of substrate 9 extends upward through this hole. In FIG. 3, reference numeral 10 identifies top of the pin that holds lead 3 in place. Reference numeral 11 identifies the hole in the lead. The top of alignment and retaining pin 10 has a thermally-formed mushroom shape so that the pin and hole cooperate to fix lead 3 to substrate 9. The four retaining clips 5-8 hold integrated circuit 4 such that the spring contact beams (not seen in FIG. 3) underneath integrated circuit 4 are held in a compressed state between the bottom (face side) of integrated circuit 4 and substrate 9.

Figure 4:
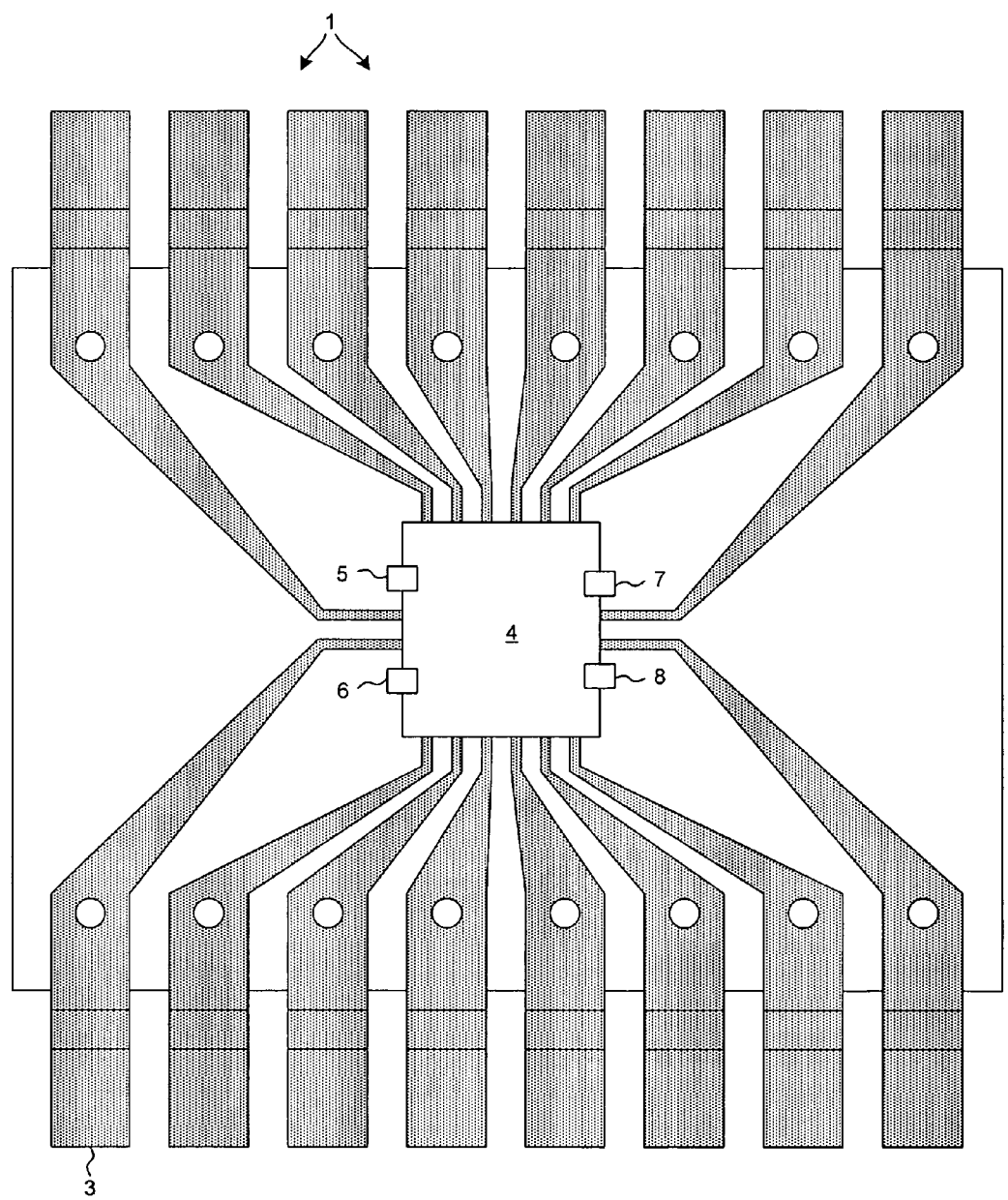
FIG. 4 is a top-down diagram of the press-fit package 1 without its encapsulant.

FIG. 4 is a top-down diagram of the press-fit package 1 without encapsulant 2.

Figure 5:
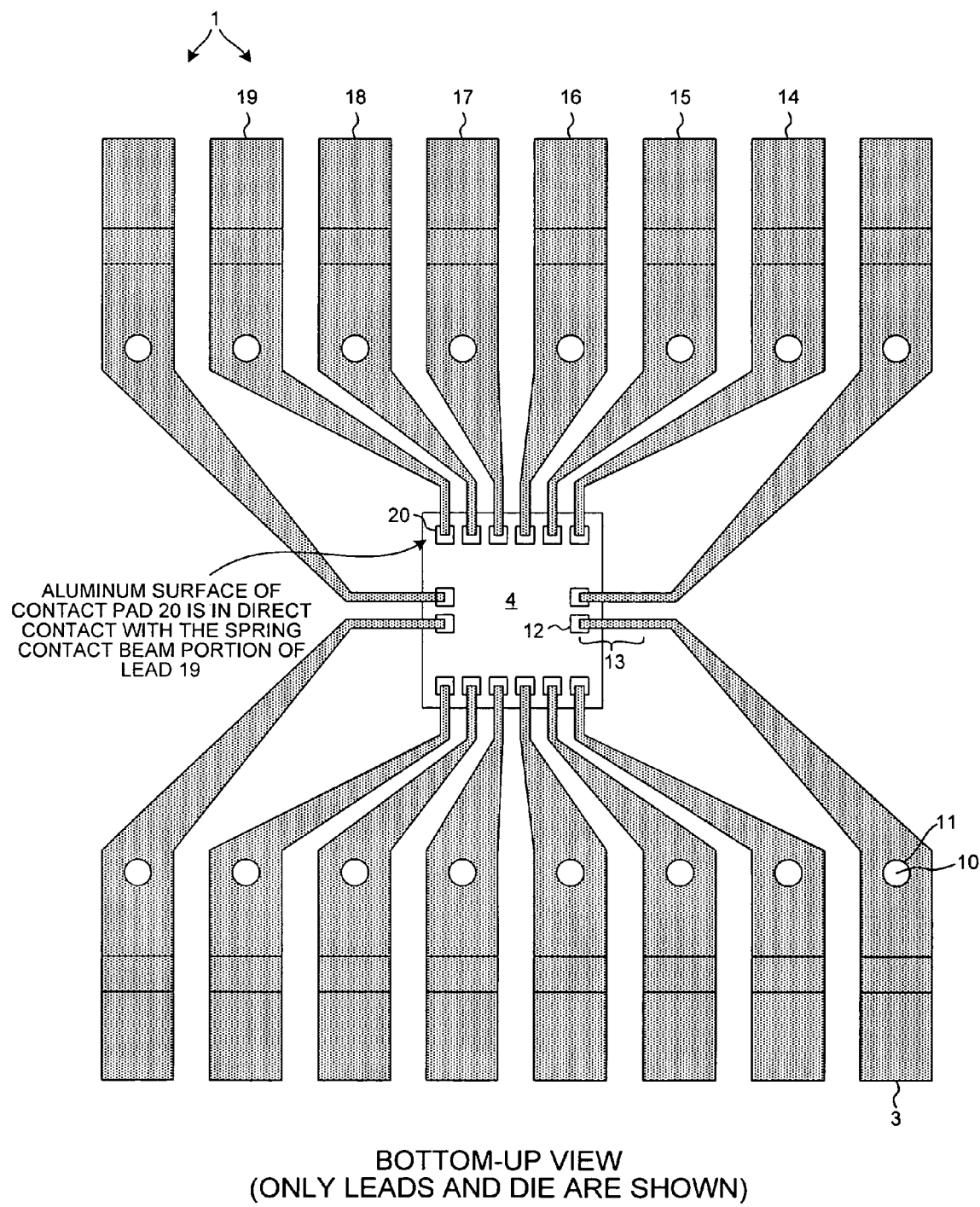
FIG. 5 is a bottom-up diagram of the leads and the integrated circuit of press-fit package 1.

FIG. 5 is a bottom-up diagram of the leads and the integrated circuit of package 1. The face side of the integrated circuit die 4 is seen in the view of FIG. 5. The face side includes a peripheral ring of contact pads. Reference numeral 12 identifies one such contact pad. The contact surface of each of the contact pads is substantially planar and in the present embodiment is aluminum (for example, pure aluminum or copper-doped aluminum). There are no flip-chip bond bumps on the contact pads, and no diffusion barrier metals and no adhesion layers and no special UBM layers. In one advantageous aspect, the pads do not include any gold, nickel, tungsten, titanium, tin or lead. Die 4 may, for example, be about 20.0 mils thick. The contact pads may be 2.5 mils square, and may be disposed about 2.5 mils from the edges of the die.

As illustrated in FIG. 5, the spring contact beam end of each lead extends inward toward the integrated circuit 4 and makes contact with a corresponding one of the contact pads. For example, spring contact beam portion 13 of lead 3 makes contact with contact pad 12. As the integrated circuit die 4 shifts slightly during circuit operation, and over temperature changes, slight differential movement scrubs aluminum oxide from the surface of the aluminum pad and maintains good electrical contact between the spring contact beam and the pad.

Figure 6:
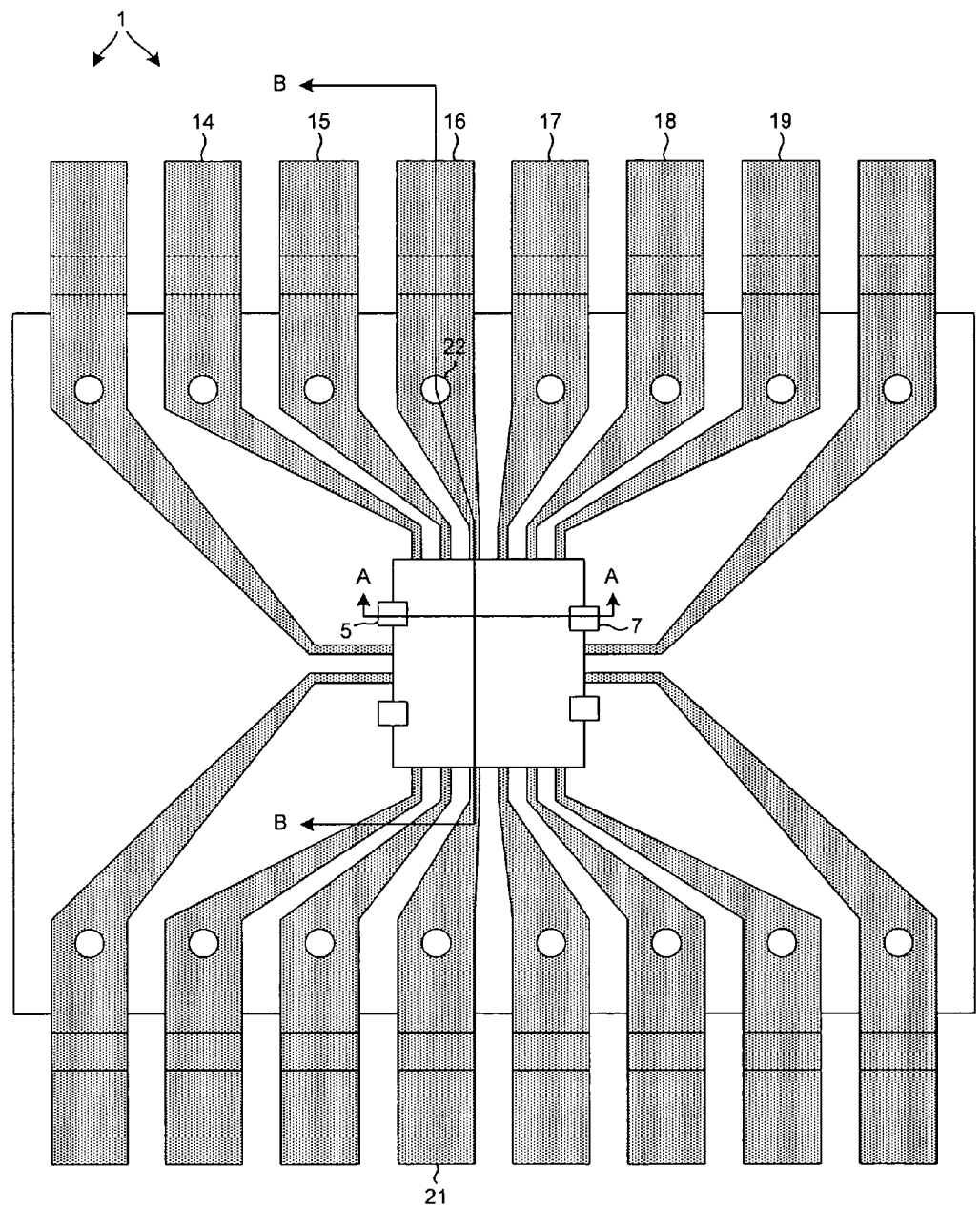
FIG. 6 is a top-down diagram of press-fit package 1 that shows sectional line A-A and sectional line B-B.

FIG. 6 is a top-down diagram of press-fit package 1. This diagram shows sectional line A-A and sectional line B-B.

Figure 7:
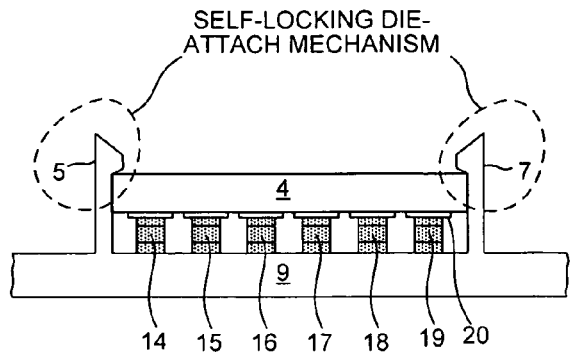
FIG. 7 is a cross-sectional diagram taken along sectional line A-A of FIG. 6.

FIG. 7 is a cross-sectional diagram taken along sectional line A-A of FIG. 6. Flexible barb-shaped retaining clips 5 and 7 extend upward from the sheet portion of substrate 9. The substrate 9, including its retaining clips 5-8, is a single piece of injection molded plastic. Integrated circuit die 4 is press-fit engaged down into and is retained by retaining clips 5-8. The retaining clips 5-8 hold integrated circuit 4 such that it presses downward and compresses the spring contact beam portions of the ends of the leads. The ends of six such compressed spring contact beam portions 14-19 are seen in the view of FIG. 7. Each spring contact beam portion makes physical and electrical contact with a corresponding one of the pads of integrated circuit 4. For example, spring contact beam 19 makes contact with pad 20.

Figure 8:
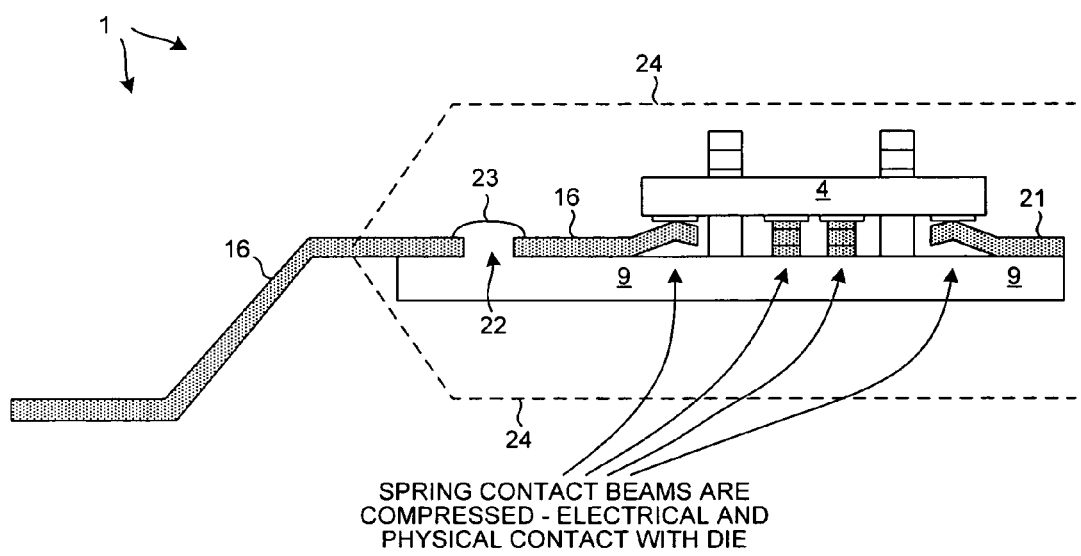
FIG. 8 is a cross-sectional diagram taken along sectional line B-B of FIG. 6.
Figure 12:
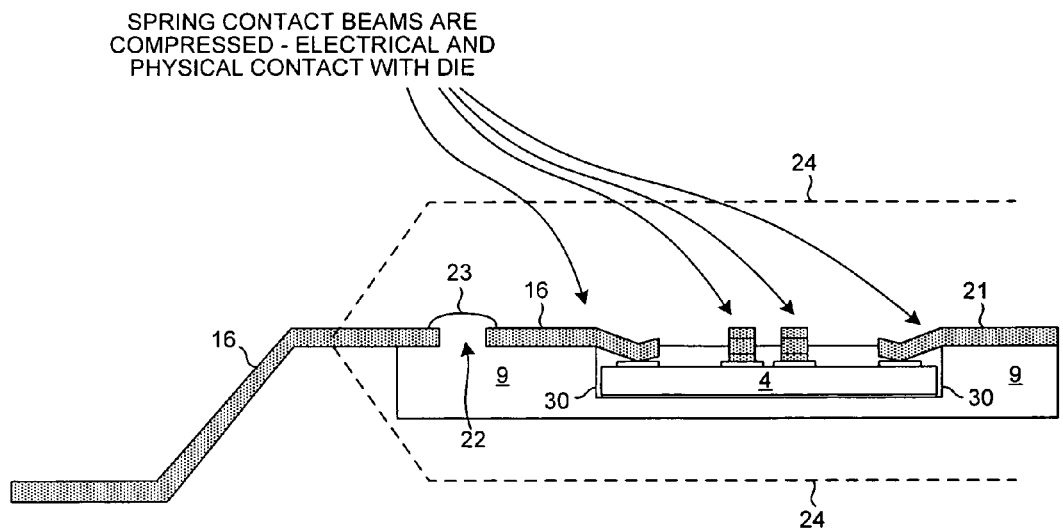
FIG. 12 is a cross-sectional diagram of a portion of the third embodiment.

FIG. 8 is a cross-sectional diagram taken along sectional line B-B of FIG. 6. In this view, the sides of two spring contact beams portions of leads 16 and 21 are illustrated. Lead 16 is fixed to substrate 9 by hole 22 and a mushroom-shaped alignment and retaining pin 23. The term "mushroom-shaped" refers to a button or pin having a larger diameter head portion that is supported by a shaft portion of a smaller diameter. Dashed line 24 in FIG. 12 represents the boundary of the injection molded encapsulant 2 in the case of the embodiment of FIG. 1. Lead 16, when considered extending from left to right in the illustration, extends from the gull-wing-portion, laterally along the upper planar surface of substrate 9 to the right, and then bends upward such that the right end of the lead is suspended above the upper surface of substrate 9.

FIGS. 9A-9E illustrate steps in a novel method of assembling the novel press-fit package 1. First, substrate 9 is injection molded and a leadframe of leads is stamped. The leadframe may, for example, be a part of a strip of leadframes. The various leads of each leadframe are joined by small connecting rails of metal. The leadframe and substrate are then placed together such that the alignment and retaining pins of the substrate extend through corresponding holes in the leads. The ends of the pins are then melted so that the pins take on a mushroom shape and fix the leads to the substrate.

Next, integrated circuit die 4 is picked up by a vacuum collet 25 attached to the head of a pick and place machine. Integrated circuit 4 in the vacuum collet 25 is illustrated in FIG. 9A.

Figure 9E:
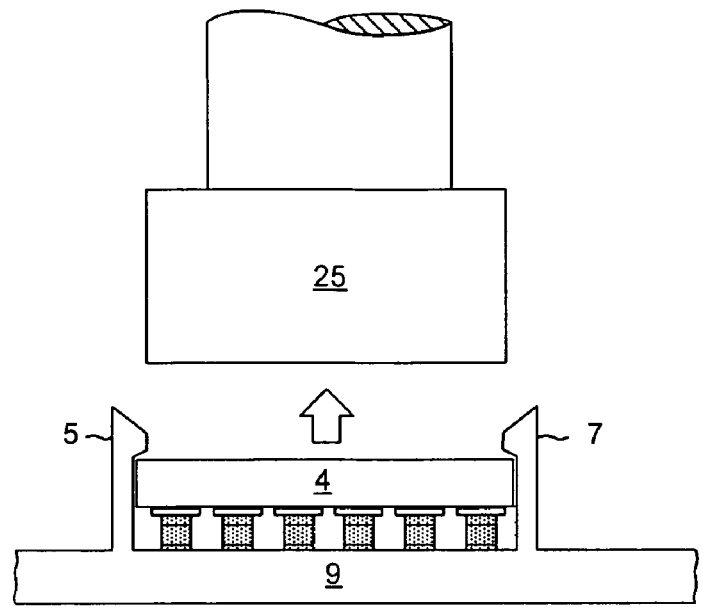

Next, collet 25 is moved toward the leadframe/substrate assembly as illustrated in FIG. 9B. As collet 25 pushes down farther, the flexible retaining clips flex outward as illustrated in FIG. 9C. Although in the illustrated example die 4 presses against the retaining clips and applies the necessary pressure to deflect the retaining clips, in other examples the collet and retaining clips are shaped such that the collet (not the die) applies the deflecting pressure. As collet 25 pushes down farther, the pads on the face side of integrated circuit 4 make contact with the spring contact beams of the leads and then compress the leads as illustrated in FIG. 9D. The retaining clips snap back so that their barbs extend over the upper edges of integrated circuit. Next, the vacuum in collet 25 is released and collet 25 is moved up and away from substrate 9 as illustrated in FIG. 9E. Integrated circuit 4 is left retained in the retaining clips of substrate 9 such that the spring contact beam portions of the leads remain compressed and pressing upward against their corresponding pads on the face side of integrated circuit 4. After the die has been press-fit by this method, an amount of conformal encapsulant is applied over the integrated circuit and is allowed to harden. In the example of FIG. 1, the encapsulant encases both sides of the substrate, the integrated circuit and the retaining clips. In the example of FIG. 2, the encapsulant is a glob-top that conformally covers only part of the upper side of the package and covers die 4 and retaining clips 5-8. Next, the rails of the leadframe are cut and the ends of the leads are bent into a gull wing shape in a cut-and-bend stamping process. The cutting away of the rails singulates and separates the leads, one from another. The cutting/stamping process also cuts the package from other packages being made along the same strip of leadframes.

Figure 11:
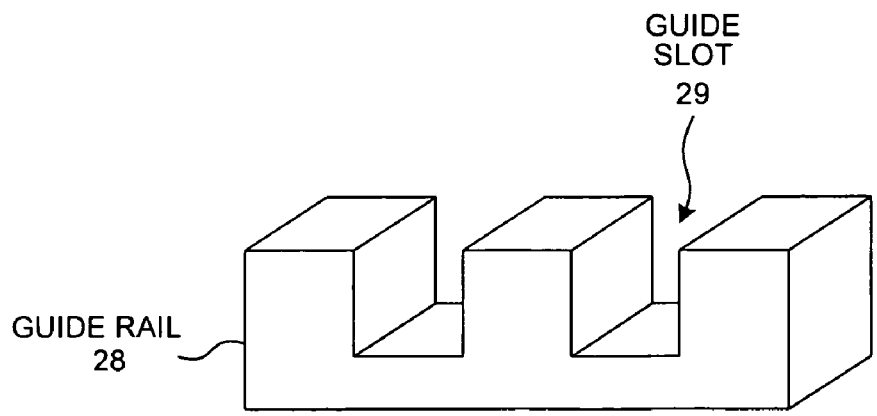
FIG. 11 is a perspective view of a guide rail 28 having two guide slots. This guide rail 28 is part of the substrate 9 in the second embodiment.
Figure 10:
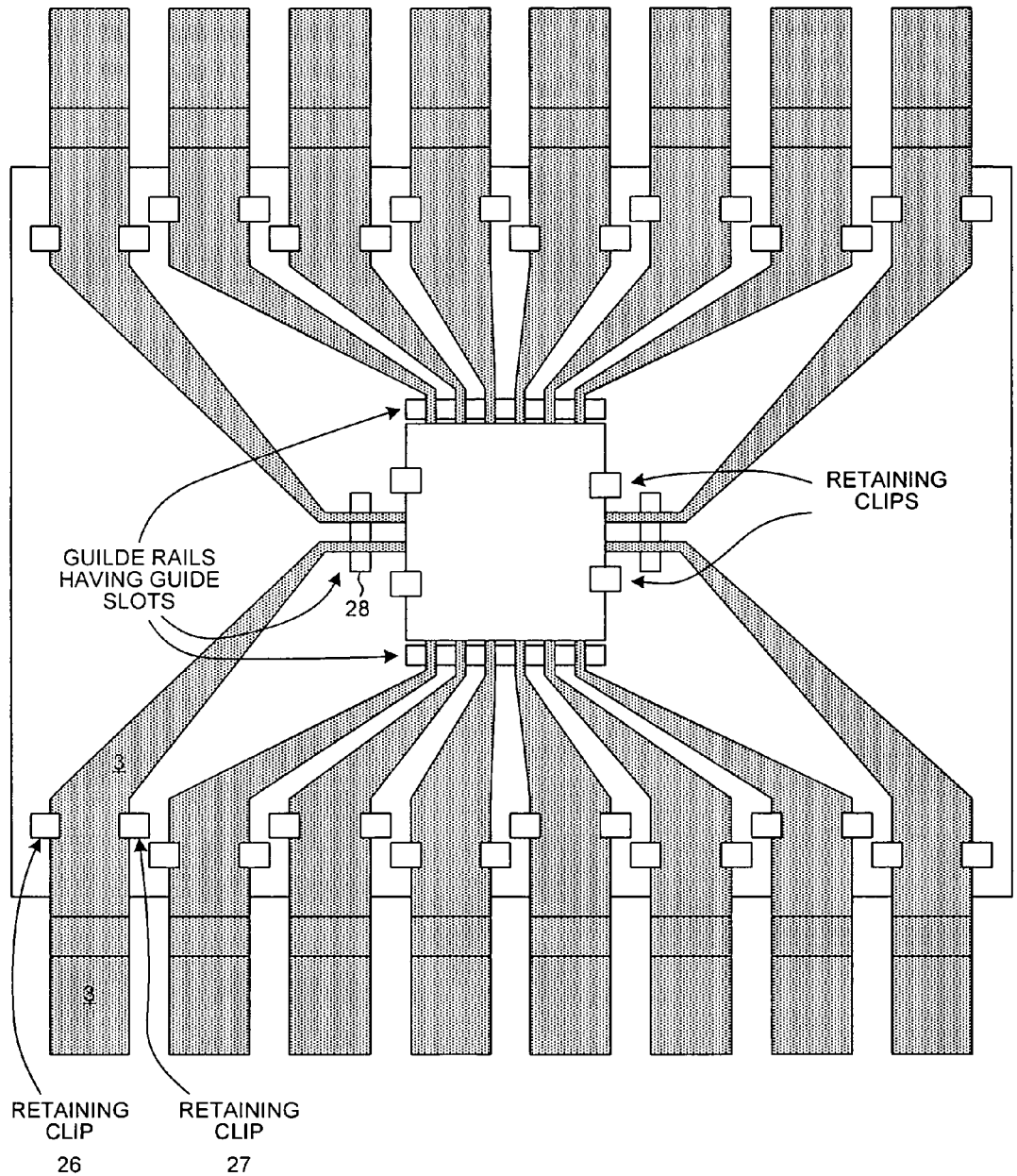
FIG. 10 is a top-down diagram of a second embodiment in which the leads are press-fit attached to the substrate without any thermal welding and without any adhesives.

FIG. 10 is a top-down diagram of the leads and substrate and integrated circuit of a second embodiment. In this embodiment, the pins of the substrate are not thermally-welded to hold the leads in place. The leads do not have holes for accommodating such pins. Rather, the leads of the leadframe press-fit into a second set of retaining clips. Each lead in the diagram is held on two sides by a retaining clip. For example, lead 3 is held in place by retaining clips 26 and 27. The spring contact beam portion ends of the leads are held in place in the lateral dimension by guide slots in guide rails. FIG. 11 is a perspective view of guide slots in the guide rail 28 of FIG. 10. Lead 3 extends through guide slot 29. The spring contact beam portion ends of the leads are held down by integrated circuit 4. Accordingly, in the embodiment of FIG. 10, the leads are attached to the substrate in a press-fit mechanical pressing operation without the use of adhesives or thermal welding.

FIG. 12 is a cross-sectional diagram of a portion of a third embodiment. In this embodiment, injection molded substrate 9 includes an indentation 30. Integrated circuit 9 is placed in the indentation face side up. The leadframe is attached to the substrate so that the spring contact beams bend downward into the indentation. The leadframe is pressed down onto substrate 9, and the tops of the alignment and retaining pins of substrate 9 are melted to form the mushroom shape and to fix the leads to substrate 9. The cut and bending step is then performed to singulate the leads from each other and to form the outward ends of the leads into the desired shape. Die 4 is held in place by the pressing action of the spring contact beam portions without the use of flexible plastic retaining clips extensions of substrate 9.

Figure 13:
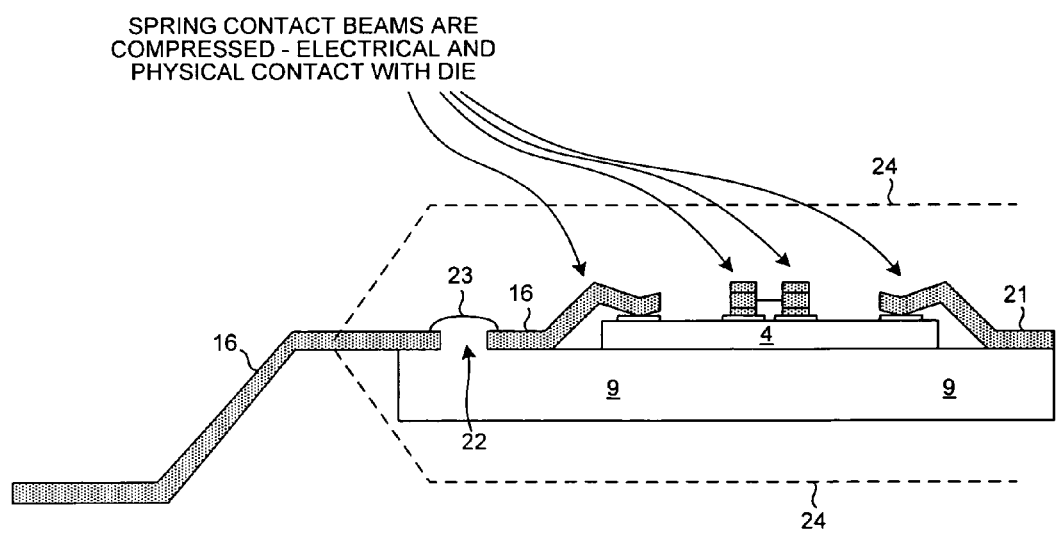
FIG. 13 is a cross-sectional diagram of a portion of a fourth embodiment.

FIG. 13 is a cross-sectional diagram of a portion of a fourth embodiment. In this embodiment, integrated circuit die 4 is not disposed in an indentation in substrate 9, rather the leads are formed such that they extend upward and over the edge of the upper face side of the die. The die 4 is disposed on the upper planar major surface of substrate 9 as illustrated. Die 4 is held in place by the pressing action of the spring contact beam portions without the use of flexible plastic retaining clips extensions of substrate 9.

Although certain specific embodiments are described above for instructional purposes, the teachings of this patent document have general applicability and are not limited to the specific embodiments described above. The die retaining clips may be disposed at the four corners of the die cavity, to hold down the four corners of the die, as opposed to the placement illustrated in FIG. 3. A die retaining clip may extend along substantially the entire length of a side of the die. The die may be retained by die retaining clips that are not parts of an injection molded substrate. For example, metal structures of the leadframe can be bent to form retaining clips that are usable to hold the die in place. In some examples, retaining clips are not used to hold the die down and in contact with the spring contact beams, but rather the integrated circuit die is placed in a cap. The cap is then pressed down onto the substrate such that the die within the cap is pressed, face side down, onto the spring contact beams. A self-locking joining mechanism then snap-fits the cap to the substrate to hold the die in the proper position. The joining mechanism may, for example, involve barbed pins on the cap that extend into and engage corresponding holes in the plastic substrate. There are numerous different self-locking mechanisms for holding the leads in place on the substrate. In some embodiments, the leads do not have holes that engage pins of the substrate, but rather the leads are held in place by other mechanisms such as guide slots and/or press-fit self-locking lead-attach mechanisms.

In one novel aspect, a novel two-part collet is utilized. The retaining clips that hold die 4 in place are, in a first operation, deflected outward by a first part of the collet. The retaining clips may, for example, have outward extending tabs that are pressed down on by the first outer sleeve part of the collet such that the pressure forces the retaining clips to deflect and spread. Then, in a subsequent step, the second inner part of the collet places the die down onto the spring contact beam portions. While the die is being pressed down by the second part of the collet, the first part of the collet releases pressure on the retaining clips such that the retaining clips return to their undeflected condition and extend over the upper edges of the die. The second part of the collet is then removed, thereby leaving the die retained in the retaining clips.

In another novel aspect, the leads do not extend toward the die from all four sides. After the leads are attached the substrate, the integrated circuit die is slid laterally across the upper planar surface of the substrate such that the spring contact beam portions of the leads slide across the upper face side surface of the die. When the die reaches its final position, the spring contact beams portions are in proper contact with their respective corresponding pads of the die. The spring contact beam portions press on the die and perform the die retaining function. The leads may be made to press-fit attach to the substrate without any thermal welding or adhesives. In another novel aspect, the die is placed on the substrate and under the spring contact beam portions of the leads without the spring contact beam portions contacting the die. In a subsequent lead bending step, the leads are bent such that the spring contact beam portions are made to extend toward and make contact with the die. In another novel aspect, a leadframe is stamp-formed such that leads and other parts of the leadframe for a fork shape. The integrated circuit die is then slid into the fork such that the fork both retains the die in place as well as makes electrical and physical contact with the pads of the die. After the die is being held by the fork, the assembly is encapsulated such that the encapsulant supports the leads. A lead cutting and bending step is performed to singulate the leads one from another. No injection molded substrate is provided in this stamped-fork package.

Accordingly, various modifications, adaptations, and combinations of various features of the described embodiments can be practiced without departing from the scope of the invention as set forth in the claims.

What is claimed is:

1. A method comprising:
   (a) attaching a plurality of leads to a insulative plastic substrate and thereby forming an assembly, wherein each of the leads of the assembly includes a spring contact beam portion;
   (b) press-fitting an integrated circuit die into the assembly such that the integrated circuit die is retained by the assembly such that the spring contact beam portions of the leads are compressed and pressing against the integrated circuit die; and
   (c) encapsulating the integrated circuit die with an amount of conformal encapsulant, wherein the encapsulated integrated circuit die does not include flip-chip bonding bumps and wherein the encapsulated integrated circuit die is not wire-bonded to any portion of the assembly.

2. The method of claim 1, wherein the leads in (a) are attached to the insulative plastic substrate together at one time as parts of a stamped metal leadframe, wherein the insulative plastic substrate includes a plurality of mushroom-shaped pin portions, and wherein each lead is held in place at least in part by a respective one of the plurality of mushroom-shaped pin portions.

3. The method of claim 1, wherein the leads in (a) are attached together at one time as parts of a stamped metal leadframe, wherein the insulative plastic substrate includes a plurality of retaining clips, and wherein each lead is held in place at least in part by a respective one of the plurality of retaining clips.

4. The method of claim 1, wherein (b) involves pressing the integrated circuit die with respect to the insulative plastic substrate such that a retaining clip deflects and then snaps back over an edge of the integrated circuit die.

5. The method of claim 1, further comprising:
   (d) fitting a retaining pin portion of the insulative plastic substrate through a hole in one of the leads.

6. The method of claim 1, wherein the insulative plastic substrate includes a protruding retaining pin portion, and wherein the attaching in (a) includes melting an end of the retaining pin portion to form a mushroom shape and thereby fix one of the leads to the insulative plastic substrate.

7. The method of claim 1, wherein the integrate circuit die is a microcontroller used in a hand-held infrared remote control device.

8. The method of claim 1, wherein the encapsulating in (c) involves injection molding a resin around the integrated circuit die and encasing both sides of the insulative plastic substrate.

9. The method of claim 1, wherein the integrated circuit die includes a plurality of planar, aluminum contact pads, and wherein the spring contact beam portions of the leads press against the contact pads.

10. The method of claim 3, wherein the insulative plastic substrate forms a plurality of guide slots, and wherein each lead extends through a corresponding one of the guide slots.

11. The method of claim 1, wherein the plurality of leads are stamped metal leads.

12. A method, comprising:
   fitting an alignment and retaining pin on an insulative plastic substrate through a hole in one of a plurality of leads, wherein each of the plurality of leads includes a spring contact beam portion;
   attaching the plurality of leads to the insulative plastic substrate;
   press-fitting an integrated circuit die onto the insulative plastic substrate such that the integrated circuit die is retained by retaining clips and the spring contact beam portions of the plurality of leads press against the integrated circuit die; and
   encapsulating the integrated circuit die with an amount of conformal encapsulant, wherein the encapsulated integrated circuit die does not include flip-chip bonding bumps, and wherein the encapsulated integrated circuit die is not wire-bonded to any of the plurality of leads.

13. The method of claim 12, wherein the plurality of leads are attached to the insulative plastic substrate together at one time as parts of a stamped metal leadframe, wherein the insulative plastic substrate includes a plurality of alignment and retaining pins, and wherein each lead is held in place at least in part by a respective one of the plurality of alignment and retaining pins.

14. The method of claim 12, wherein the press-fitting involves pressing the integrated circuit die with respect to the insulative plastic substrate such that the retaining clips deflect and then snap back over edges of the integrated circuit die.

15. The method of claim 12, wherein contact pads are disposed on a face side of the integrated circuit die, and wherein the spring contact beam portions that press against the integrated circuit die make contact with the contact pads.

16. The method of claim 12, wherein the attaching the plurality of leads includes melting an end of the alignment and retaining pin to form a mushroom shape and thereby fix one of the leads to the insulative plastic substrate.

17. The method of claim 12, wherein the integrate circuit die is a microcontroller used in a hand-held infrared remote control device.

18. The method of claim 12, wherein the encapsulating the integrated circuit die involves injection molding a resin around the integrated circuit die and encasing both sides of the insulative plastic substrate.

19. The method of claim 12, wherein the insulative plastic substrate forms a plurality of guide slots, and wherein each lead extends through a corresponding one of the guide slots.

20. The method of claim 12, wherein the plurality of leads are stamped metal leads.

\* \* \* \* \*